United States Patent [19]

Shiralagi et al.

[11] Patent Number: 5,830,801
[45] Date of Patent: Nov. 3, 1998

[54] RESISTLESS METHODS OF GATE FORMATION IN MOS DEVICES

[75] Inventors: Kumar Shiralagi, Chandler; Richard Mauntel, Phoenix, both of Ariz.

[73] Assignee: Motorola, Inc., Schaumburg, Ill.

[21] Appl. No.: 775,909

[22] Filed: Jan. 2, 1997

[51] Int. Cl.⁶ .................................................. H01L 21/28
[52] U.S. Cl. .......................... 438/586; 438/592; 438/655; 438/656; 438/657; 438/669
[58] Field of Search ...................... 438/586, 592, 438/655, 656, 657, 669, 684, 670, 360, 353

[56] References Cited

U.S. PATENT DOCUMENTS 5,460,693  10/1995  Moslehi ............................ 156/662.1
5,543,356   8/1996  Murakami et al. .................. 437/152
5,618,760   4/1997  Soh et al. .......................... 438/703

FOREIGN PATENT DOCUMENTS 05-055215  3/1993  Japan .

*Primary Examiner*—John Niebling
*Assistant Examiner*—Thomas G. Bilodeau
*Attorney, Agent, or Firm*—Eugene A. Parsons

[57] ABSTRACT

A method of forming an MOS gate includes providing a silicon substrate having a gate oxide formed thereon, forming a polysilicon layer on the gate oxide, defining a gate area including forming an oxide mask by positioning a light mask adjacent a surface of the polysilicon layer and exposing the surface through the light mask to a deep ultra violet light in an ambient containing oxygen. A layer of metal is deposited and annealed to form a silicide only where the layer of metal and polysilicon layer are in contact. The remaining metal layer and mask are removed, using the silicide as a mask, wherein the remaining polysilicon and the silicide form an MOS gate. Sidewall spacers are formed on opposing sides of the MOS gate and used in forming self aligned source and drain regions.

14 Claims, 2 Drawing Sheets

RESISTLESS METHODS OF GATE FORMATION IN MOS DEVICES

FIELD OF THE INVENTION

The present invention pertains to the fabrication of semiconductor devices and more specifically to improved masking techniques during semiconductor device fabrication.

BACKGROUND OF THE INVENTION

In the semiconductor field it is common to sequentially grow several different layers of semiconductor material and use various masks and etching steps to form the desired devices and terminals on the devices. In some methods, masking material, e.g. nitride, oxide, or the like, is applied and photoresist is used to pattern the masking material. Material is grown/deposited/etched using masked and unmasked areas in subsequent processes. The material on the masked areas is then removed by etching and/or lift-off. In some instances material is selectively grown in unmasked areas and the masking material is then removed. One problem that arises is that the structure or substrate (generally a wafer) must be removed from the growth chamber to remove the masking material. The structure is then masked again and reintroduced into the growth chamber for re-growth.

Generally, in these prior art methods of fabricating semiconductor devices, etching is required to remove unwanted material and masks are removed by etching, solvent, or the like. During the etching and/or mask forming or removal processes, the material of the semiconductor device has a high likelihood of being contaminated by the etchant, which contamination greatly reduces the life of the device, the operating characteristics of the device, and the reliability of the device. Further, the etching process severely damages semiconductor material adjacent the etched areas which further reduces life, operating characteristics, and reliability. Also, etching processes are very time consuming and difficult to perform.

In addition to the etching problems, all known prior art fabrication processes require many interspersed growing, masking and etching steps which greatly complicate and lengthen the process. For example, when epitaxial layers are grown, the wafers must be placed in a vacuum or pressure chamber to provide the atmosphere for the growth. Each time the wafer is patterned, it must be removed from the chamber, resulting in large amounts of preparation time for each step. Also, each time wafers are removed from a chamber and subsequently replaced, the opening and preparation of the chamber (as well as the processing of the wafer) is an opportunity for additional impurities and contaminants to be introduced to the wafer.

Specifically, in the fabrication of MOS devices, typically MOS gates are fabricated by using a resist process and photolithography. Formation of the gate in an MOS structure is one of the most critical processes.

Accordingly, it would be highly desirable to provide resistless fabrication processes of MOS devices.

It is a purpose of the present invention to provide a new and improved method of fabricating MOS devices and the like using resistless processes.

It is still another purpose of the present invention to provide a new and improved method of fabricating MOS devices which do not require the introduction of contaminants, such as photoresist, solvents and etchants.

It is a further purpose of the present invention to provide a new and improved method of fabricating MOS devices which is much simpler and includes less chance of contamination of the devices.

SUMMARY OF THE INVENTION

The above problems and others are at least partially solved and the above purposes and others are realized in a method of gate formation in MOS devices including providing a substrate having a gate oxide formed thereon, forming a layer of poly material on the gate oxide, forming a resistless mask on the layer of poly material, defining a gate area, depositing a layer of metal on the resistless mask and the gate area, annealing the layer of metal to form a silicide only where the layer of metal and layer of poly material are in contact, removing the remaining metal layer and mask, and using the silicide as a mask, removing unmasked portions of the layer of poly material, wherein the remaining poly material and the silicide form an MOS gate.

In a preferred embodiment the above steps of the method are performed in-situ in a modular equipment cluster. Also, sidewall spacers are formed on opposing sides of the MOS gate and, the sidewall spacers and MOS gate are used in forming self aligned source and drain regions.

BRIEF DESCRIPTION OF THE DRAWINGS

Referring to the drawings.

DESCRIPTION OF THE PREFERRED EMBODIMENT

Figure 1:
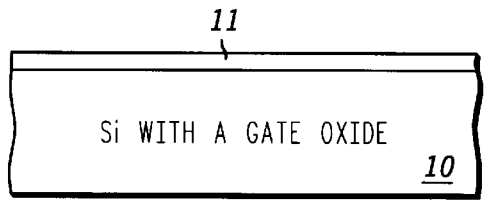
FIGS. 1 through 8 are enlarged, simplified sectional views illustrating various steps in a method of fabricating semiconductor devices in accordance with the present invention.

Turning now to the drawings in which like reference characters indicate corresponding elements throughout the several views, attention is first directed to FIG. 1 which illustrates the first step in the fabrication of a semiconductor device in accordance with the present invention. In FIG. 1, a substrate 10 is provided having a gate oxide layer 11 formed on an upper surface thereof. In this specific embodiment, substrate 10 is Silicon (Si), however, it will be understood that other semiconductor materials such as Gallium Arsenide, Indium Arsenide, III-V materials, etc. can be used.

Figure 2:
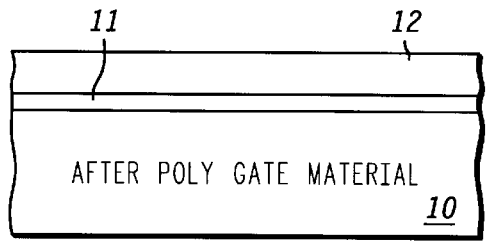

A layer 12 of poly material, which in this specific embodiment is polysilicon, is positioned on layer 11 by some convenient process such as any of the vapor deposition processes, as can be seen with reference to FIG. 2. In this embodiment, the surface of layer 12 is hydrogenated (hydrogen terminated or passivated), by methods well known in the art, to prevent instantaneous oxidation of the surface. The hydrogen termination process generally replaces, or prevents the formation of, a film of natural oxide on the surface. The hydrogenated surface may be no more than hydrogen atoms completing the crystalline structure of layer 12 at the surface. In some applications other types of passivation may be used, or the hydrogenation may not be required, and it has been found that the present technique will operate generally as described with the surface simply being clean (i.e. no foreign matter).

Figure 3:
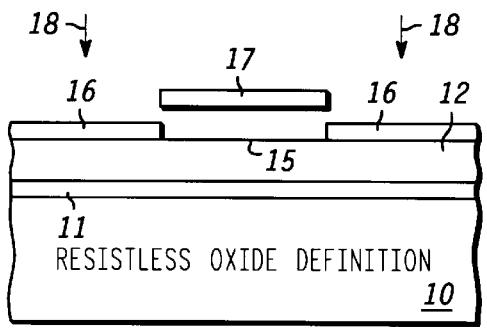

Referring to FIG. 3, a gate area 15 is defined on layer 12 by a resistless fabrication process herein described. The process includes forming a resistless mask, which in this example is an oxide mask 16, by positioning a light mask 17 adjacent a surface of layer 12 and exposing the surface through light mask 17 to a deep ultra violet light in an ambient containing oxygen. Areas other than masked gate area 15 of layer 12 are exposed to light, represented by arrows 18, which replaces the passivation with an oxide film. In the present specific example, using hydrogen termination, the light generates ozone due to optical excitation. The excitation wavelength that is most suitable for efficient ozone generation is generally the most efficient to use. In a more specific example, the light includes a wavelength of approximately 185 nm, which is where an oxygen absorption peak exists. The ozone reacts with the surface of layer 12, replacing the hydrogen termination with oxide mask 16. The exposure to light can be performed under a lamp. However, when the light is collimated, as in an aligner or stepper, sharp features can be defined. Once oxide mask 16 is formed, light mask 17 is removed.

Figure 4:
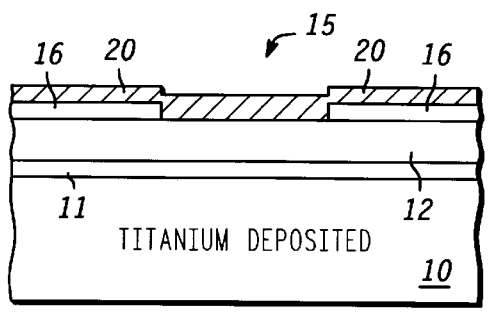
Figure 5:
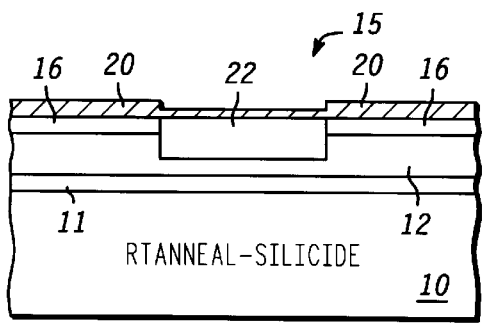
Figure 6:
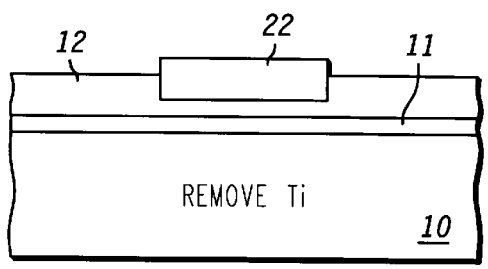

Turning now to FIG. 4, a layer 20 of metal is deposited on oxide mask 16 and gate area 15. The metal used in layer 20 is of a type which will combine with the poly layer to form a silicide. In this specific example, titanium is used, as it can produce a lower resistance silicide. The structure is then annealed to react the metal and the poly material to form a silicide layer 22. In the preferred embodiment, rapid temperature (RT) annealing is used. Annealing layer 20 of metal to form silicide layer 22 occurs only where layer 20 of metal and layer 12 are in contact. While layer 20 generally overlies all of layer 12, oxide mask 16 prevents the silicide reaction in areas other than gate area 15. After forming silicide layer 22, any remaining metal of layer 20 and oxide mask 16 are removed as shown in FIG. 6.

Figure 7:
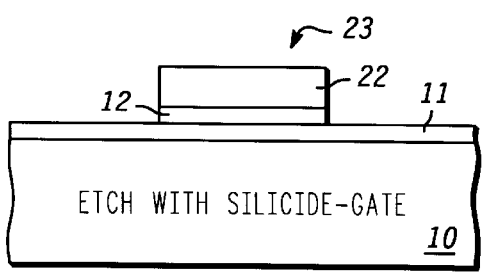

As illustrated in FIG. 7, portions of layer 12 are removed using silicide layer 22 as a mask. During the etch process gate oxide layer 11 operates as an etch stop. The remaining portions of layer 12 and silicide layer 22 form an MOS gate 23. In MOS structure fabrication, formation of the gate is one of the most critical and difficult processes. The above process discloses a resistless technique for fabricating an MOS gate. Each of the previously described steps are performed in-situ in a modular equipment cluster. Modular equipment clusters include a series of devices utilized in fabrication steps, such as epitaxial growth by MBE/CBE etc., etching and other techniques required in the process. All of these steps are performed in-situ without requiring the removal of the substrate from the chamber.

Figure 8:
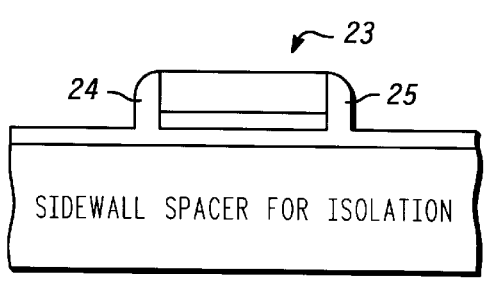
Figure 9:
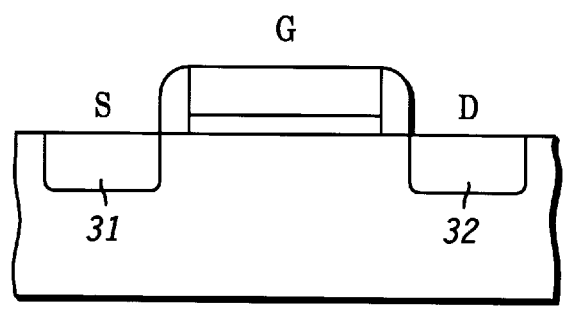
FIG. 9 is an enlarged, simplified sectional view of an MOS device with self aligned source and drain regions.

With reference to FIG. 8 sidewall spacers 24 and 25 are formed on opposing sides of MOS gate 23. Sidewall spacers 24 and 25 and MOS gate 23 are used in forming self aligned source and drain regions. A typical MOS structure 30 is illustrated in FIG. 9 utilizing the novel process of fabrication disclosed above. In this structure, a source 31 and drain 32 are formed in substrate 10 utilizing sidewall spacers 24 and 25 and MOS gate 23 as a mask. Formation of source 31 and drain 32 can be accomplished using a variety of known techniques, such as implantation, diffusion, etc.

Thus an improved method of fabricating MOS gates and devices is disclosed. All current semiconductor processes use a photoresist based process to fabricate devices. The photoresists and solvents to remove them are major contaminants in the semiconductor devices. By eliminating the use of photoresists tremendous cost savings, improvements in yield, improvements in device operation and life, etc. are realized. Elimination of photoresist also enables the fabrication of devices mostly in-situ reducing all of the contamination, particulates, and clean room issues that effect the production of devices. All steps can be performed in-situ, i.e. without removal from the chamber, however the source and drain formation may be performed more convenient externally.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of gate formation in MOS devices comprising the steps of:

providing a substrate having a gate oxide formed thereon;

forming a layer of poly material on the gate oxide;

forming a resistless mask on the layer of poly material, defining a gate area;

depositing a layer of metal on the resistless mask and the gate area;

annealing the layer of metal to form a silicide only where the layer of metal and layer of poly material are in contact;

removing remaining metal layer and mask; and using the silicide as a mask, removing unmasked portions of the layer of poly material, wherein the remaining poly material and the silicide form an MOS gate.

2. A method as claimed in claim 1 wherein the step of providing the substrate having the gate oxide formed thereon includes providing a silicon substrate having a gate oxide formed thereon.

3. A method as claimed in claim 2 wherein the step of forming the layer of poly material includes depositing a layer of polysilicon.

4. A method as claimed in claim 3 wherein the step of forming the resistless mask includes hydrogen terminating the layer of polysilicon.

5. A method as claimed in claim 4 wherein the step of forming the resistless mask further includes forming an oxide mask by positioning a light mask adjacent a surface of the layer of poly material and exposing the surface through the light mask to a deep ultra violet light in an ambient containing oxygen.

6. A method as claimed in claim 5 wherein the step of depositing the layer of metal includes depositing titanium.

7. A method as claimed in claim 1 further including the step of forming sidewall spacers on opposing sides of the MOS gate.

8. A method as claimed in claim 7 further including using the sidewall spacers and MOS gate in the formation of additional MOS elements.

9. A method as claimed in claim 8 wherein the formation of additional MOS elements includes forming self aligned source and drain regions.

10. A method as claimed in claim 1 wherein the steps are performed in-situ in a modular equipment cluster.

11. A method of gate formation in MOS devices comprising the steps of:

providing a silicon substrate having a gate oxide formed thereon;

forming a polysilicon layer on the gate oxide;

defining a gate area including forming an oxide mask by positioning a light mask adjacent a surface of the polysilicon layer and exposing the surface through the light mask to a deep ultra violet light in an ambient containing oxygen;

depositing a layer of metal on the resistless mask and the gate area;

annealing the layer of metal to form a silicide only where the layer of metal and polysilicon layer are in contact;

removing remaining metal layer and mask; and using the silicide as a mask, removing unmasked portions of the polysilicon layer, wherein the remaining polysilicon and the silicide form an MOS gate.

12. A method of gate formation in MOS devices as claimed in claim 11 wherein the step of forming the oxide mask further includes hydrogen terminating the polysilicon layer prior to exposure to deep ultra violet light.

13. A method as claimed in claim 11 wherein the steps are performed in-situ in a modular equipment cluster.

14. A method of fabricating an MOS device comprising the steps of:

providing a silicon substrate having a gate oxide formed thereon;

forming a polysilicon layer on the gate oxide;

defining a gate area including forming an oxide mask by positioning a light mask adjacent a surface of the polysilicon layer and exposing the surface through the light mask to a deep ultra violet light in an ambient containing oxygen;

depositing a layer of metal on the resistless mask and the gate area;

annealing the layer of metal to form a silicide only where the layer of metal and polysilicon layer are in contact;

removing remaining metal layer and mask;

using the silicide as a mask, removing unmasked portions of the polysilicon layer, wherein the remaining polysilicon and the silicide form an MOS gate;

forming sidewall spacers on opposing sides of the MOS gate; and using the sidewall spacers and MOS gate in forming self aligned source and drain regions.

* * * * *